(12) United States Patent
Luong et al.

(10) Patent No.: US 7,411,468 B2
(45) Date of Patent: Aug. 12, 2008

(54) LOW VOLTAGE LOW-PHASE-NOISE OSCILLATOR

(75) Inventors: Howard Cam Luong, Kowloon (HK); Ka-Chun Kwok, Kowloon (HK)

(73) Assignee: Hong Kong University of Science and Technology, Hong Kong (CN)

( * ) Notice: Subject to any disclaimer, the term of this patent is extended or adjusted under 35 U.S.C. 154(b) by 91 days.

(21) Appl. No.: 10/650,686

(22) Filed: Aug. 29, 2003

(65) Prior Publication Data

US 2005/0046499 A1 Mar. 3, 2005

(51) Int. Cl.
*H03B 5/08* (2006.01)
(52) U.S. Cl. ................ 331/167; 331/167; 331/117 R
(58) Field of Classification Search ............. 331/36 L, 331/117 R, 117 FE, 111, 112, 113 R, 46, 331/167
See application file for complete search history.

(56) References Cited

U.S. PATENT DOCUMENTS

| | | | |
|---|---|---|---|
| 3,156,876 A | 11/1964 | Fischman et al. | |
| 4,542,450 A | 9/1985 | Patel | |
| 5,912,596 A * | 6/1999 | Ghoshal | 331/117 R |
| 5,942,928 A * | 8/1999 | Tchamov et al. | 327/227 |
| 6,229,406 B1 | 5/2001 | Wang | |
| 2002/0008594 A1 * | 1/2002 | Shirai | 331/117 FE |
| 2002/0140516 A1 * | 10/2002 | Dufour et al. | 331/167 |
| 2004/0066241 A1 * | 4/2004 | Gierkink et al. | 331/46 |

OTHER PUBLICATIONS

Pietro Andreani et al., A 2.2 GHz CMOS VCO with Inductive Degeneration Noise Suppression, IEEE 2001 Custom Integrated Circuits Conference, 2001, pp. 197-200.
Niklas Troedsson et al., An Ultra Low Voltage 2.4GHz CMOS VCO, IEEE 2002 Radio and Wireless Conference, 2002, pp. 205-208.
Niklas Troedssen et al., High Performance 1V 2.4GHz CMOS VCO, IEEE 2002 Asia Pacific Conference, 2002, pp. 185-188.
Mitsuru Harada et al., WP 23.2 0.5-1V 2GHz RF Front-end Circuits in CMOS/SIMOX, IEEE 2000 International Solid-State Circuits Conference, 2000, pp. 378-379 and pp. 471.
Neric Fong et al., A Low-Voltage Multi-GHz VCO with 58% Tuning Range in SOI CMOS, IEEE 2002 Custom Integrated Circuits Conference, 2002, pp. 423-426.
Ahmed H. Mostafa et al., A Sub-1-V 4-GHz CMOS VCO and a 12.5-GHz Oscillator for Low-Voltage and High-Frequency Applications, IEEE Transaction on Circuits and Systems-II: Analog and Digital Signal Processing, 2001, pp. 919-926, vol. 48, No. 10.

* cited by examiner

*Primary Examiner*—Joseph Chang
(74) *Attorney, Agent, or Firm*—Schwabe, Williamson & Wyatt, P.C.

(57) ABSTRACT

There is a disclosed an oscillator for generating a periodic signal, comprising a transistor and two electro-magnetically coupled inductors in positive feedback configuration, one of the inductors is connected to the drain or gate of the transistor, and the other being connected to the source to maintain the same phase of the two voltages at the two nodes. Two or more of such single ended oscillators can be connected together to form a differential oscillator, and the invention can be generalized by the use of any active device and not just transistors.

19 Claims, 12 Drawing Sheets

LOW VOLTAGE LOW-PHASE-NOISE OSCILLATOR

FIELD OF THE INVENTION

This invention relates to an oscillator, and in particular to an oscillator capable of working at a low voltage with low phase noise.

BACKGROUND OF THE INVENTION

Voltage-controlled oscillators (VCO) are one of the most essential building blocks in phase-locked loops and frequency synthesizers, which are required in all data and telecommunication communication systems to generate highly accurate timing reference sources.

Typical oscillators use inductors and capacitors as resonant tars for signal oscillation. Active circuits compensate for any loss in the tank and sustain the oscillation. For an ideal case, the oscillation signal is a pure tone (FIG. 1a). However, noise in the circuit is converted into phase noise, which is exhibited as a roll-off skirt in the frequency spectrum (FIG. 1b). This phase noise determines the frequency purity of the oscillating source and significantly affects the signal-to-noise and bit-error-rate performance of the whole system.

Phase noise follows the classical Leeson-Cutler model $$S_{SSB} = F \frac{kT}{2P_{sig}} \frac{w_o^2}{Q^2 \Delta \omega^2}$$

where F is an empirical parameter that quantifies how effectively the noise is converted into phase noise and $P_{sig}$ is the power of the oscillating signal.

To minimize the phase noise, the conversion factor F of the noise to the phase noise needs to be minimized while the signal power needs to be maximized.

The basic mechanism behind the generation of phase noise can be understood by considering a simple LC tank with impulse current noise. In FIG. 2(a), if the noise impulse is applied at the peak of the output voltage, only the voltage amplitude will be changed, and current noise is only converted to amplitude noise. On the other hand, as shown in FIG. 2(b), if the noise impulse is applied at a zero-crossing point of the output waveform, the voltage is time shifted. This is equivalent to an instantaneous change in oscillation frequency. In this case, current noise is converted to phase noise.

This observation demonstrates that careful positioning and aligning of the noise injection relative to the output voltage waveform can help to achieve the lowest possible phase noise conversion.

For an oscillator with a signal current I and a tank impedance Z, the output amplitude is simply given by V=I×Z. To maximize the output amplitude, either I or Z can be increased. However, increasing current would result in an increase in power consumption, which is not desirable in many wireless and portable applications.

Alternatively, the impedances Z can be increased to increase the output amplitude. Consider a simple LC tank with the inductor's series resistance in FIG. 3. As illustrated in the figure, for a fixed oscillation frequency, maximizing L and minimizing C can be beneficial. Firstly, the tank impedance increases at the center frequency, which gives larger signal amplitude for a given bias current. This minimizes phase noise and maximizes current efficiency. Secondly, the filtering capability of the tank (or quality factor Q) increases, which can help filtering out the random frequency fluctuation and again minimizes phase noise.

As the tank impedance increases with L, the loop gain also increases and gives better startup reliability of the oscillator.

A large L/C ratio, however, gives a smaller frequency tuning range of the oscillator because the tuning of the capacitance C is limited to a narrower range. The following table summarises the options depending on the desired objective.

| LOW-POWER LOW-PHASE-NOISE OPTIMIZATION SUMMARY | | |
|---|---|---|
| | low power | low phasenoise |
| L | maximize | maximize |
| C | minimize | minimize |
| R | minimize | minimize |
| Amplitude | minimize | maximize |

PRIOR ART

As shown in FIG. 4 a differential pair with an LC tank is a conventional topology for an oscillator design. In such a design the drain voltages are out of phase to each other. When $n_1$ increases, the differential pair switches bias current $I_{tail}$ from $I_{drain1}$ to $I_{drain2}$. For the next cycle, $n_1$ decreases, current switches back from $I_{drain2}$ to $I_{drain1}$. In this manner, the transient current has a square shape, and oscillation is sustained. At large oscillation amplitude, $n_1$ is near $2V_{dd}$ and $n_2$ is near ground. As a result, the MOS transistor at the left hand side goes into the linear region, and its drain current drops. As observed from the timing diagram, FIG. 5, the drain current is no longer a square shape. The drain current exhibits two peaks, which are close to the zero-crossing point of the oscillation waveform and as a result, device noise is injected into the tank at the most sensitive instance and leads to high phase noise conversion.

The drain current at high oscillation amplitude is a distorted square wave. It can be easily shown that the $1^{st}$ harmonic of this distorted square wave is smaller than the $1^{st}$ harmonic of a pure square wave. As a result, for a given bias current, the oscillator gives smaller oscillation amplitude if the transistors switch into the linear region for a portion of the cycle. This results in a low current and power efficiency of the conventional design for large oscillation amplitude and small phase noise.

Colpitts oscillator, as shown in FIG. 6(a), is another conventional design suitable for low phase noise. With $C_1$ and $C_2$ as the positive feedback elements, an oscillation is sustained. In Colpitts oscillator, the transistor has less chance to be in the linear region. When the drain voltage drops, the source voltage drops at the same time due to the effect of the capacitor divider. In other words, the drain and source voltage are in phase. If the voltage across $C_1$ is large enough such that $V_{ds}$ is always larger than $V_{ds(min)}$, the transistor can operate in the saturation region for most of the oscillation cycle.

An important feature is the timing and shape of the drain current. As observed from the conceptual timing diagram in FIG. 6(b), as $V_D$ drops below a certain value, the transistor turns on and the drain current appears as a pulse shape. Therefore, noise injection appears only at the peak of the voltage waveform where phase noise sensitivity is at a minimum. Therefore Colpitts oscillator achieves good phase noise performance. A pulse shape waveform also has higher $1^{st}$ harmonic than a square shape waveform. Therefore, for a given bias current, Colpitts oscillator has larger oscillation amplitude, and higher current and power efficiency, than the differential LC tank oscillator.

However, while Colpitts oscillator satisfies the minimization requirement of the phase noise conversion, it is not suitable to achieve a maximum L/C ratio and thus maximum output amplitude as discussed above, particularly for oscillator design at few gigahertz. As seen from the Colpitts schematic, the positive feedback is by a capacitor divider. These capacitors constitute parts of the total tank capacitor. For a given frequency tuning range requirement, a varactor (variable capacitor) must be added to the tank. As a result, for a given oscillation frequency, the L/C ratio is limited. With a limited L/C ratio for Colpitts, the loop gain is small at the center frequency and startup reliability decreases. This is one of the reasons why startup is sometimes a problem for Colpitts.

SUMMARY OF THE INVENTION

According to the present invention there is provided a single-ended oscillator for generating a periodic signal, comprising a transistor and two electromagnetically coupled inductors in positive feedback configuration, wherein one of the said inductors is connected to the drain of the transistor and the other is connected to the source to maintain the same phase of the two voltages at the two nodes.

In preferred embodiments of the invention the transistor may be a PMOS (P-channel metal oxide semiconductor), NMOS(N-channel metal oxide semiconductor), PNP (bipolar transistor), or NPN (bipolar transistor) transistor.

In some embodiments of the invention the transistor acts as a voltage-controlled current source, while in other embodiments it may act as a current-controlled current source.

In some embodiments the two inductors may be formed as a two-port transformer.

In particularly preferred embodiments a differential oscillator may be provided comprising two singe-ended circuits that are cross-coupled together electro-magnetically for an additional positive feedback. The two single-ended circuits may share a common bias current source, and they may be cross-coupled positively with each other both electro-magnetically and/or electrically. For example electro-magnetic feedback may be achieved by the coupling of the inductors while electric feedback is obtained by cross coupling the input and output nodes of the two active devices.

Preferably a differential oscillator may be formed in which the two coupled inductor pairs or the two two-port transformers are grouped together as a single multi-port transformer.

More generally, in preferred embodiments the present invention enables the design of a multiple-phase oscillator comprising a plurality of single-ended branches a plurality of cross-couplings between said single-ended branches to provide a plurality of outputs with different output phases.

According to another aspect of the invention there is provided a single-ended oscillator for generating a periodic signal, comprising a transistor and two electro-magnetically coupled inductors in positive feedback configuration, wherein one of the said inductors is connected to the gate of the transistor and the other is connected to the source to maintain the same phase of the two voltages at the two nodes.

Viewed from a further aspect the present invention also extends to a single-ended oscillator for generating a periodic signal, comprising a transistor and two electro-magnetically coupled inductors in positive feedback configuration, wherein one of the said inductors is connected to the drain or the gate of the transistor and the other is connected to the source to maintain the same phase of the two voltages at the two nodes.

Viewed from a still further aspect the present invention also extends to a single-ended oscillator for generating a periodic signal, comprising an active device and two electro-magnetically coupled inductors in positive feedback configuration, wherein one of the said inductors is connected to the drain or gate of the active device and the other is connected to the source to maintain the same phase of the two voltages at the two nodes.

BRIEF DESCRIPTION OF THE DRAWINGS

Some embodiments of the invention will now be described by way of example and with reference to the accompanying Figures, in which.

DETAILED DESCRIPTION OF PREFERRED EMBODIMENTS

Figure 1:
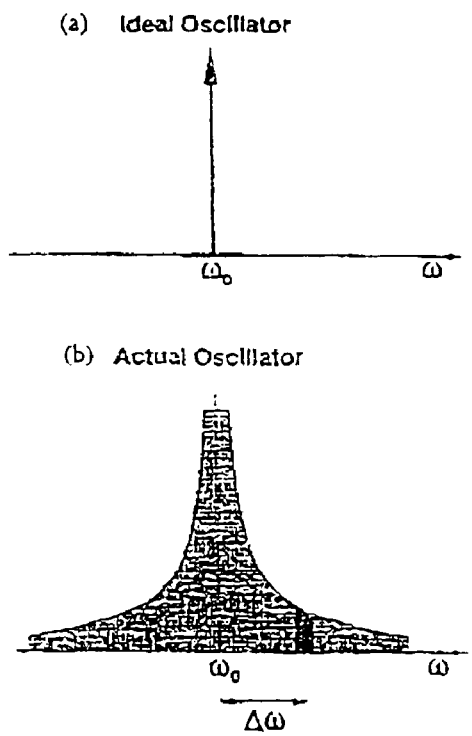
FIGS. 1(a) and (b) show (a) an ideal frequency spectrum for a pure oscillator, and (b) the effect of phase noise.
Figure 2:
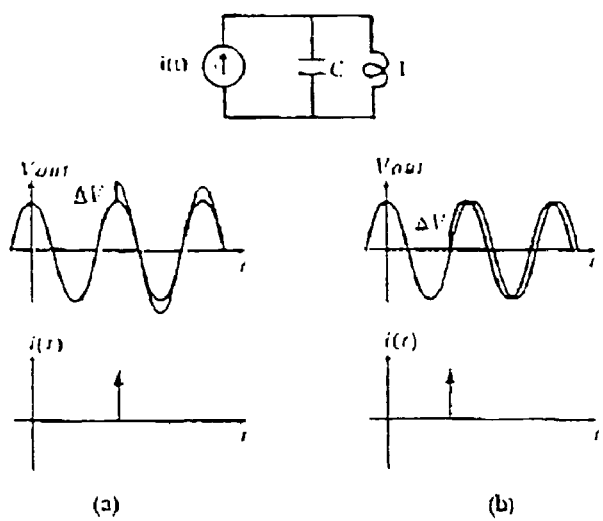
FIG. 2 illustrates the effect of phase noise on a simple LC resonant tank.
Figure 3:
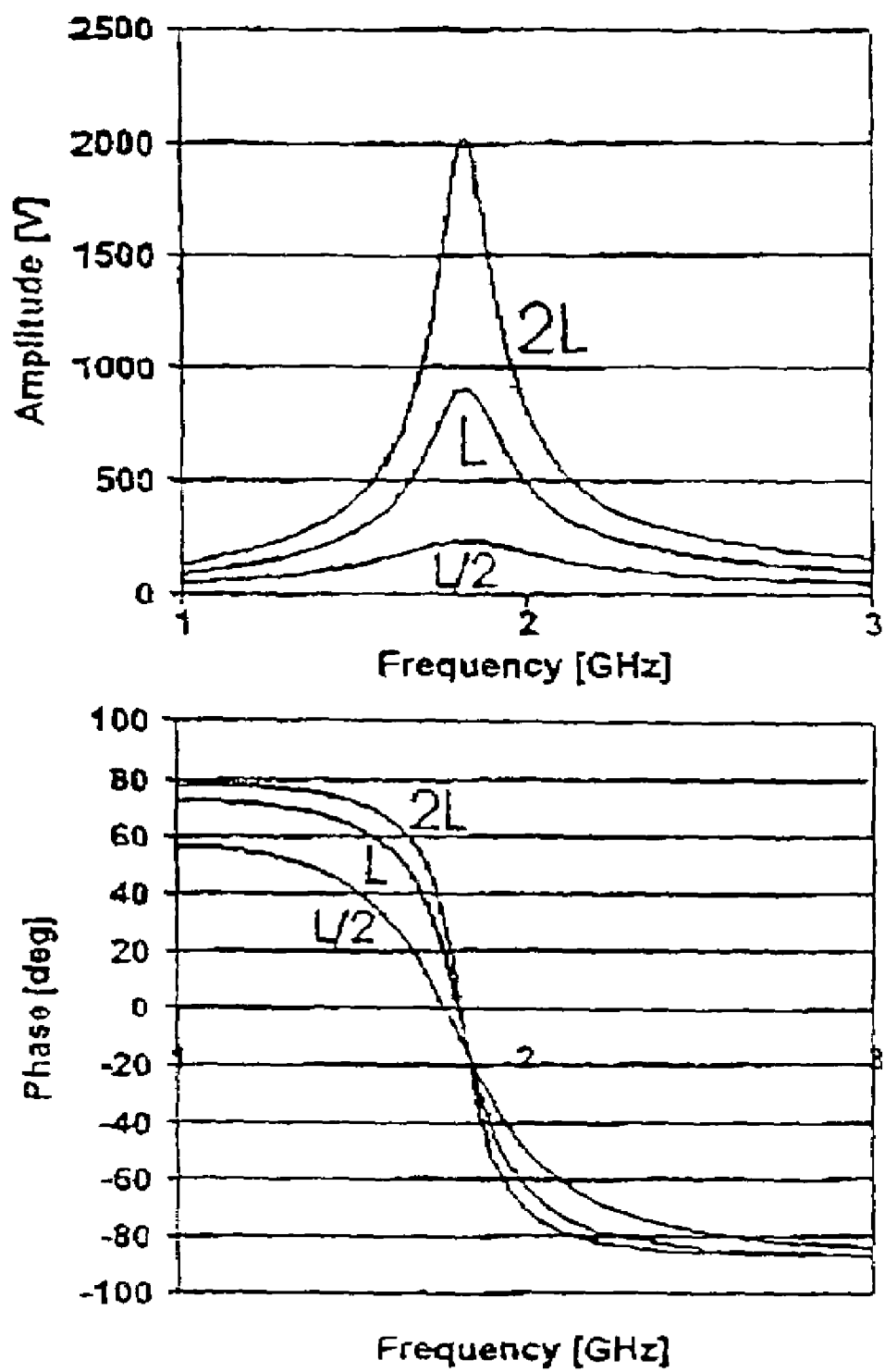
FIG. 3 illustrates the effect of changing L and C in a simple resonant tank.
Figure 4:
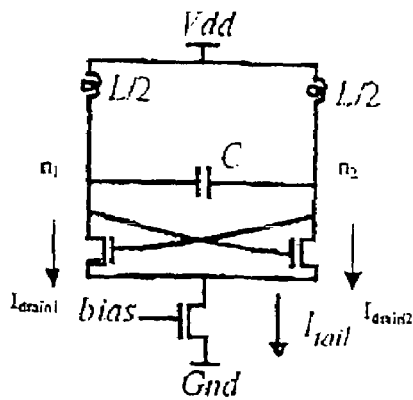
FIG. 4 shows a differential oscillator according to the prior art.
Figure 5:
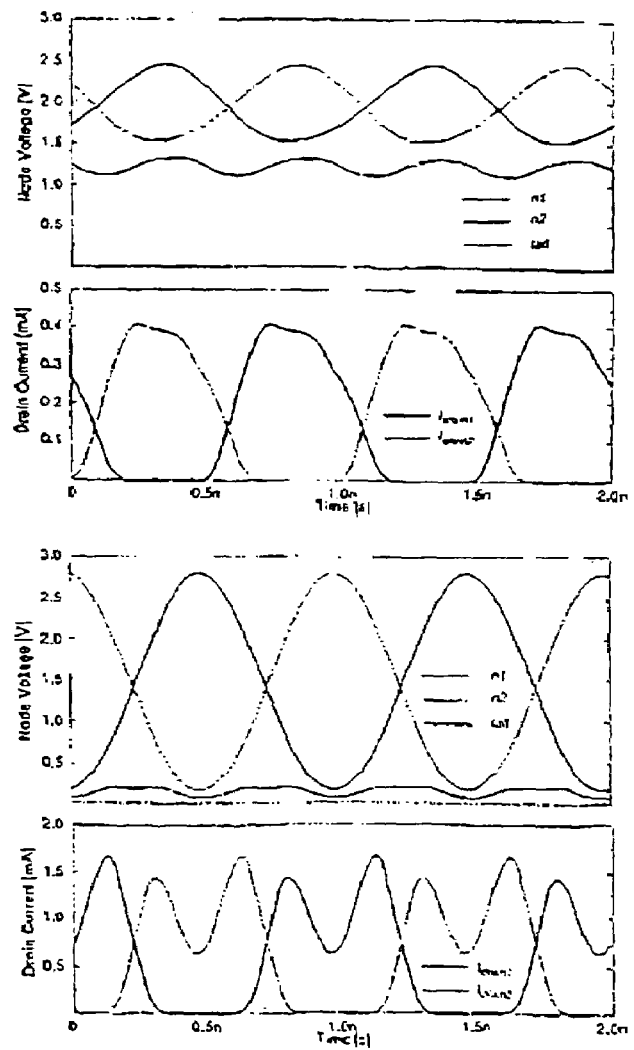
FIG. 5 shows the timing diagram of the prior art oscillator of FIG. 4, FIGS. 6(a) and (b) show (a) a prior art Colpitt's oscillator and (b) a corresponding timing diagram.
Figure 6A:
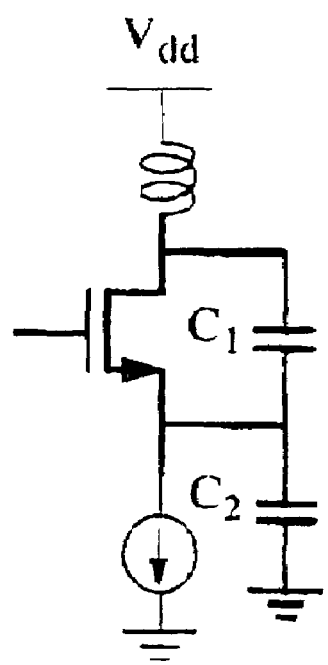
Figure 6B:
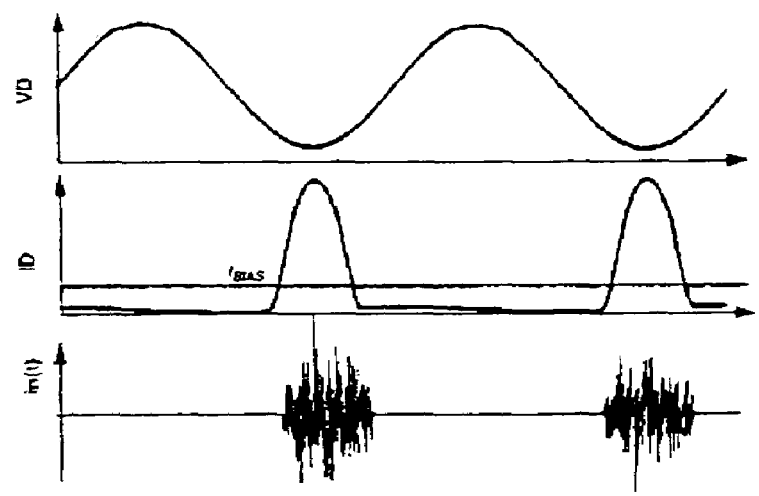
Figure 7:
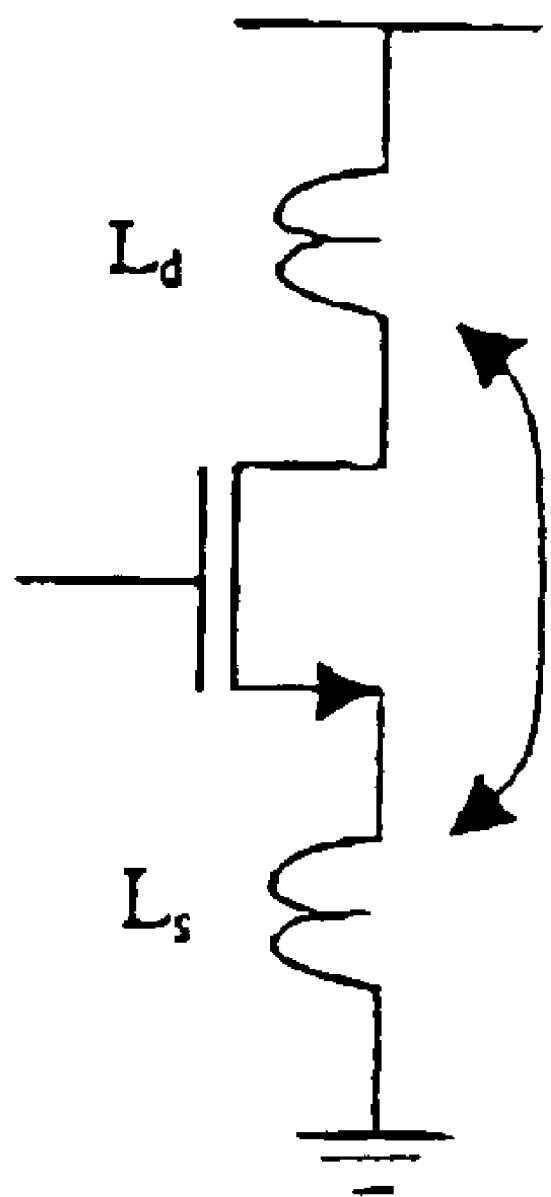
FIG. 7 shows the basic principle of an oscillator according to an embodiment of the invention employing a common-gate design.

The basic principle behind the present invention is to replace the capacitive feedback by a transformer-based feedback, as shown in FIG. 7. This provides not only the same advantages as the Colpitts oscillator in terms of pulse shaping the drain current to minimize the phase noise conversion but can also allow maximization of the L/C ratio to maximize the output amplitude. In addition, the tank capacitors are only limited by the total parasitic capacitance, including the transistors' parasitic, wiring parasitic and varactor capacitance. It should be noted here that FIG. 7 may be considered a common-gate design, but an alternative design uses a common drain and this will de described further below with reference to FIGS. 18 to 21.

The circuit of FIG. 7 operates as follows. When the drain voltage drops, by magnetic coupling between $L_d$ and $L_s$ illustrated by the arrows, the source voltage drops. The transistor turns on and its drain current increases. As a result, the drain voltage decreases again. This constitutes a positive feedback loop.

By magnetic coupling between $L_d$ and $L_s$, the drain and source voltage are in phase. If the drain source voltage $V_{ds}$ always larger than $V_{ds(min)}$, the transistor stays in the saturation region for most of the oscillation cycle. The drain current has a pulse shape around the peak of the output voltage. This has the same effect as the Colpitts oscillator and thus achieves minimum noise to phase noise conversion.

Since no feedback capacitor is used, the L/C ratio can be maximized. The loop gain is high at the center frequency, the oscillation start-up is guaranteed, and a good filtering response can be achieved. Compared to the Colpitts design, oscillators constructed in accordance with preferred embodiments of the present invention have the capability to operate at a much lower supply voltage. In a Colpitts oscillator, the transistor source node must connect to a current source because it is the path for the feedback. The minimum supply voltage is therefore the total voltage across the transistor and across the bias current source. In contrast, by using a transformer as the feedback the transistor's source node can be directly connected to ground via the secondary coil. This eliminates the voltage headroom across the bias current source.

More importantly, the main reason for low-voltage capability comes from the signal swing for a given supply voltage. In a Colpitts oscillator, the maximum amplitude is $2V_{dd}$. In an embodiment of the present invention, due to both the load and source inductors, the drain voltage can swing to $2V_{dd}$, and the source voltage can swing to negative and thus gives extra signal swing. This enables the oscillator to operate at a supply voltage much lower than the threshold voltages of the transistors.

Figure 8:
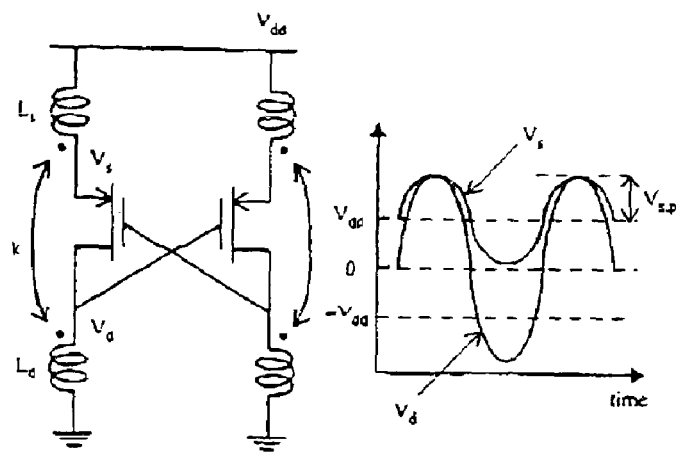
FIG. 8 shows a low-voltage oscillator according to an embodiment of the present invention.

A first embodiment of the invention shown in FIG. 8 illustrates in particular the possibility of ultra-low voltage operation that results from the fact that the oscillator design gives extra voltage headroom for low voltage applications. Because the source voltage can swing below the ground potential, care must be taken to avoid forward biasing of the source-substrate PN diode junction during transient. Consequently, given an N-well process, only PMOS transistors can be used with the source node connected to the body of an isolate N-well. As the mobility of PMOS transistor is lower than NMOS transistor the transistors size needs to be large to obtain the same transconductance. This in turn degrades the frequency tuning range. A single transistor with drain-to-source magnetic coupling is an important aspect of the present invention, but other forms for the design are possible. In the embodiment shown in FIG. 8, for example, two such transistors are cross-coupled to each other. This topology has three positive feedback loops, one from the transistor's cross-coupling and the other two from the drain-to-source magnetic coupling.

In this embodiment the primary coil with self-inductance $L_d$ is connected at the drain, which together with parasitic capacitance comprises the LC tank. The secondary coil with self-inductance $L_s$ is connected at the source. $L_d$ and $L_s$ are magnetically coupled together with a coupling factor k. With the transformer feedback, the drain voltage swings below the ground potential and the source voltage swings above $V_{dd}$. This effectively doubles the signal amplitude. In other words the transformer provides a positive feedback loop across the drain and source nodes while the cross-coupled differential pair compensates for losses in the tanks.

By the transformer feedback action, the drain and source voltages are in phase. When the gate voltage decreases, the drain and source voltages increase. The effective gate-source over-drive is enlarged for a given supply voltage. Compared to a conventional design, the swing at the source node effectively boosts up the supply voltage to a higher value during transient and this enables the supply to be lower than the transistor's threshold voltage. Compared with the prior art this embodiment of the invention provides lower supply voltage, higher carrier power and lower phase noise.

Table 1 appended to this description shows measurements that were obtained from an oscillator constructed in accordance with FIG. 8 and show that this oscillator can oscillate at a frequency of about 1.38 GHz and at a supply voltage of 0.35V, which is approximately half of the threshold voltage of the PMOS transistors.

Table 2 at the end of this description summarizes end compares the performance of the embodiment of FIG. 8 with a number of prior art low-voltage oscillators [1] to [6] details of which are given below.

Design [1] [M. Harada, et al, "0.5-1V 2 GHz RF Front-end Circuits in CMOS/SIMOX," IEEE International Solid State Circuits Conference, 2000.] uses a special SOI process with un-doped MOSFET for which threshold voltages for NMOS and PMOS transistors are −0.22V and +0.16V, respectively. As a result, the low voltage capability comes from the device technology but not the circuit design technique.

Designs [2] [N. Fong, et al, "A Low-Voltage Multi-GHz VCO with 58% tuning range in SOI CMOS," IEEE Custom Integrated Circuits Conference, 2002.]and [3] [P. Andreani, et al, "A 2.2 GHz CMOS VCO with Inductive Degeneration Noise Suppression," IEEE Custom Integrated Circuits Conference, 2001.] operate at supply voltages that are at least 2 times larger than the threshold voltages of the transistors while designs [4] [N. Troedsson, et al, "High Performance 1V 2.4 GHz CMOS VCO," IEEE Asia Pacific Conference, 2002.], [5] [A. Mostafa, et al, "A Sub-1-V 4-GHz CMOS VCO and a 12.5-GHz Oscillator for Low-Voltage and High-Frequency Applications," IEEE Transactions on Circuits and Systems II, October, 2001.], and [6] [N. Troedsson, et al, "An Ultra Low Voltage 2.4 GHz CMOS VCO," IEEE Radio and Wireless Conference, 2002.] operate with lower supply voltage but still larger than the transistors' threshold voltages.

In contrast to the prior art, the supply voltage of an embodiment of the present invention can be only about half of the transistor's threshold voltage. Therefore the present invention shows superior performance in terms of low voltage capability. For the higher supply voltage, as demonstrated by the second embodiment to be described below, the invention can operate at much higher frequencies with much lower power consumption while maintaining comparable phase noise.

Figure 9:
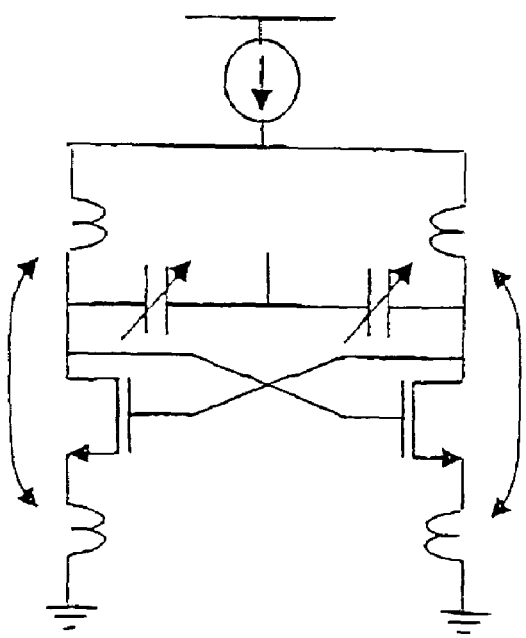
FIG. 9 shows a low-power high-frequency oscillator according to an embodiment of the present invention.

To further demonstrate the advantages of embodiments of the invention for applications with low power, low phase noise and high frequency, a second embodiment (FIG. 9) will be described that is suitable for 1-V 5.2-GHz applications. In this embodiment, NMOS transistors are used because a deep N-well layer is now available, which allows isolation of the body of a NMOS transistor to the p-substrate. The tuning is done by a varactor with a tuning range of 20%, and cross coupling between two cores is used. A current bias source is applied at the common node of the drain inductors to achieve better control of bias current. The two pairs of coupled inductors are laid out to share the same center. In this way, the four inductors magnetically coupled to one another, which increases the positive feedback and minimizes the chip area (and also cost).

Simulation results of the second embodiment are summarized as follows.

| Supply voltage | Average power | Center Frequency | Phase Noise @ 600 KHz | Process |
|---|---|---|---|---|
| 1.0 V | 1.0 mW | 5.2 GHz | 115 dBc/Hz | 0.18 μm CMOS |

Figure 10:
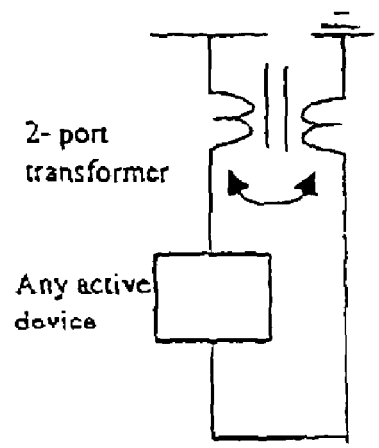
FIG. 10 shows an embodiment of the invention in which the two inductors are implemented by a two-port transformer.
Figure 11:
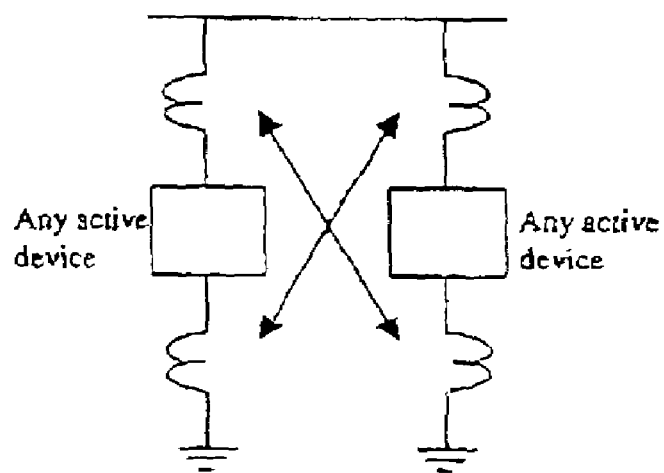
FIG. 11 shows an embodiment of the invention in the form of a generalized differential oscillator using any active device.
Figure 12:
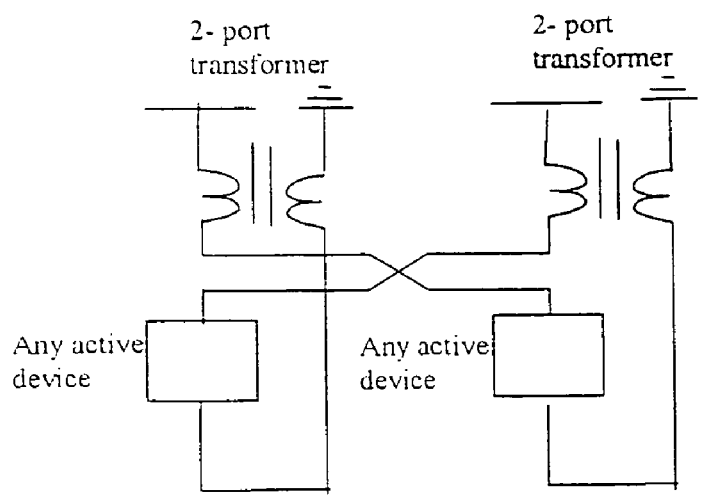
FIG. 12 shows a modification of the embodiment of FIG. 11 in which the inductor pairs are implemented by two-port transformers.

A range of other possible embodiments wilt also be described. To begin with instead of using two inductors as shown in FIG. 7, a further possibility is that the two inductors could be replaced with a two-port transformer as shown in FIG. 10. FIG. 11 illustrates a more general concept than FIGS. 7 and 9 and shows in particular that the PMOS and NMOS transistors of those embodiments may be replaced by any active device. FIG. 11 shows a differential oscillator formed of two pairs of inductors, whereas FIG. 12 shows the same concept but with the inductors replaced by two-port transformers.

Figure 13:
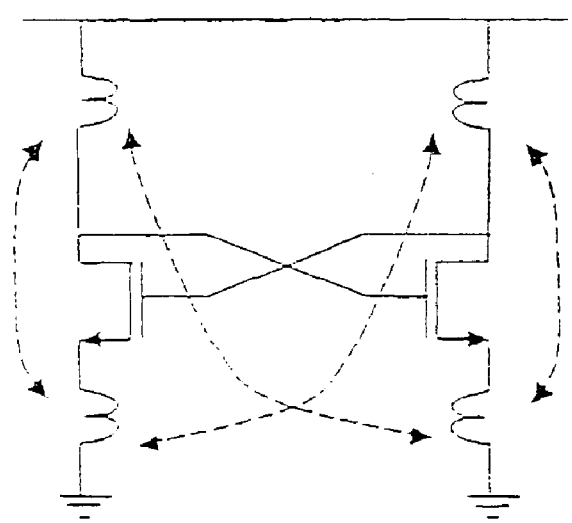
FIG. 13 shows an embodiment of the invention in the form of a differential oscillator with electrical cross-coupling.

FIG. 13 illustrates a differential oscillator in which the two-single-ended circuits are cross-coupled positively with each other both electro-magnetically and electrically. The electro-magnetic feedback is obtained by the magnetic coupling of the inductors, while electrical feedback is achieved by cross-coupling the input and output nodes of the two active devices.

Figure 14:
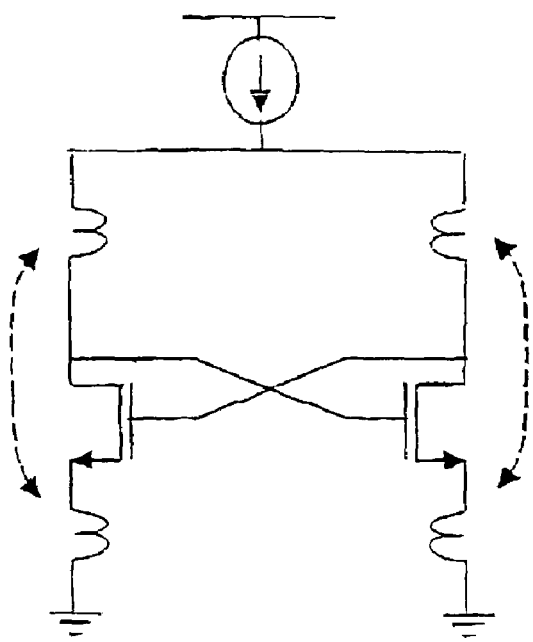
FIG. 14 shows an embodiment of the invention in the form of a differential oscillator with a bias current source connected at the common node of the load inductors.
Figure 15:
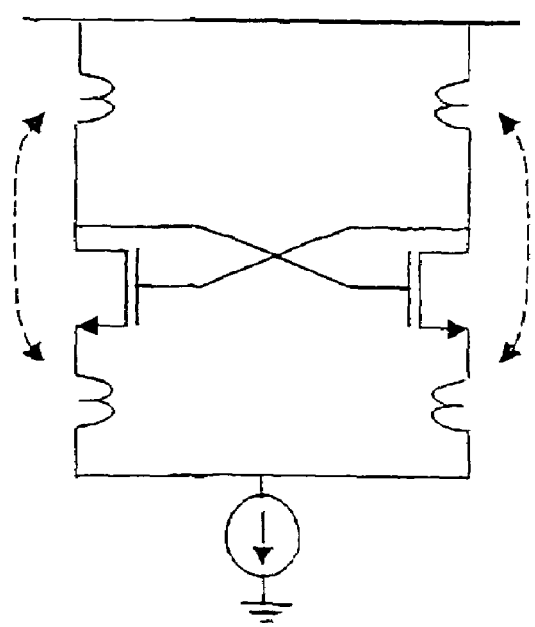
FIG. 15 shows an embodiment of the invention in the form of a differential oscillator with a bias current source connected at the common node of the degeneration inductors.

FIGS. 14 and 15 illustrate differential oscillators in which the two single-ended circuits share a common bias current source. In the embodiment of FIG. 14 the common current bias is connected at the common node of the load inductors, while in FIG. 15 it is connected at the common node of the degeneration inductors.

Figure 16:
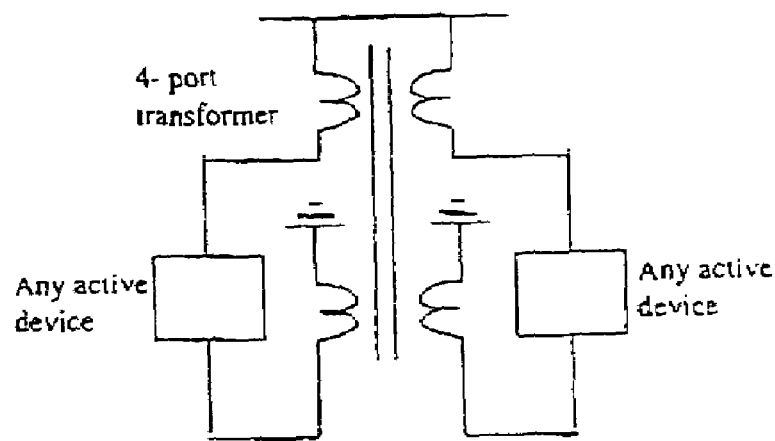
FIG. 16 shows an embodiment of the invention in the form of a differential oscillator with the two inductor pairs being implemented by a four-port transformer.

FIG. 16 shows an embodiment of the invention in which the two coupled inductor pairs or the two two-port transformers are grouped together to share the same magnetic core to minimize the chip area while maximizing the coupling. The core material can be air, silicon oxide or any other suitable magnetic core material. This is equivalent to replacing the two two-port transformers or the two coupled inductor pairs with a single four-port (multiple coil) transformer.

Figure 17:
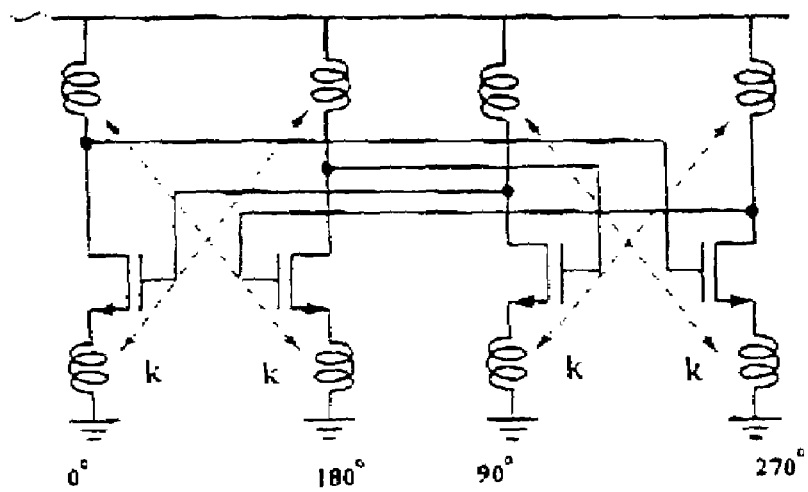
FIG. 17 shows an embodiment of the invention in the form of a multiple oscillator having multiple cross-coupled branches and multiple outputs.
Figure 18:
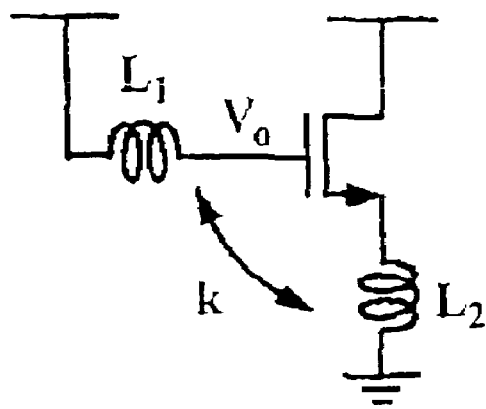
FIG. 18 shows the basic principle of an alternative embodiment of the present invention employing a common-drain design.

Another possibility is that multiple single-ended oscillators could be provided electrically and electro-magnetically cross-coupled so as to provide multiple outputs at different phases. FIG. 17 shows an example of this embodiment in which four single-ended oscillators are provided with four electromagnetic cross-couplings, and four electrical cross-couplings. Four outputs are obtained from this multiple oscillator structure at respectively 0°, 180°, 90° and 270°.

In the embodiments described above the inductor is connected to the drain of the transistor and may be regarded as a common-gate design. An alternative possibility, shown in FIG. 18, however, is that the inductor $L_1$ may be connected to the gate of the transistor, with the other inductor $L_2$ connected to the source. This may be regarded as a common drain configuration.

Figure 19:
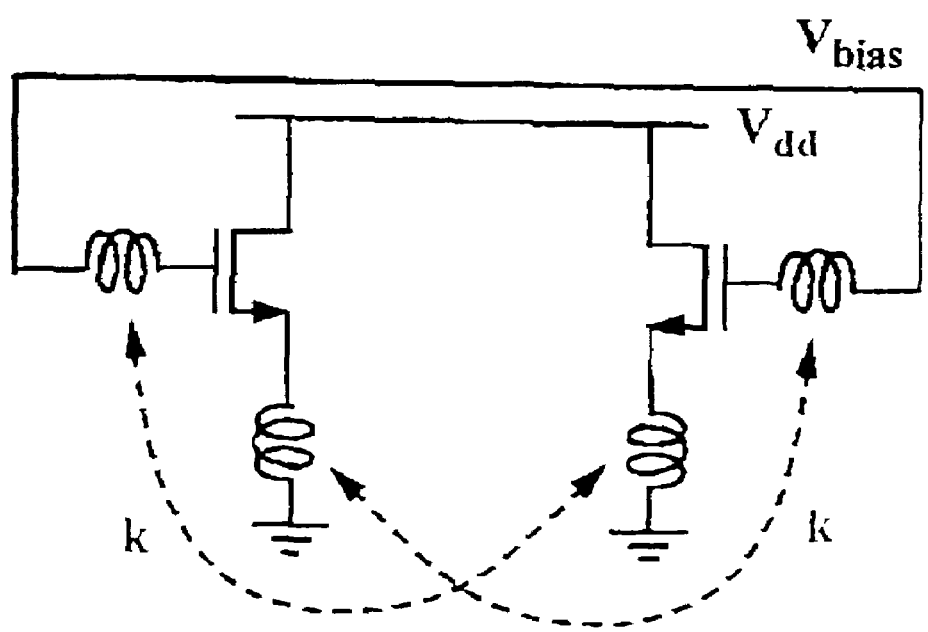
FIG. 19 shows an embodiment of the invention in the form of a common-drain differential oscillator.

As in the common gate design a differential oscillator by magnetically cross-coupling a pair of single-ended circuits as shows in FIG. 19 in which the inductor $L_1$ connected to the gate of one transistor, is magnetically coupled (by coupling factor k) to the second inductor $L_2$ that is connected to the source of the other single-ended circuit, with the drains of the two circuits being connected to a common voltage $V_{dd}$.

Figure 20:
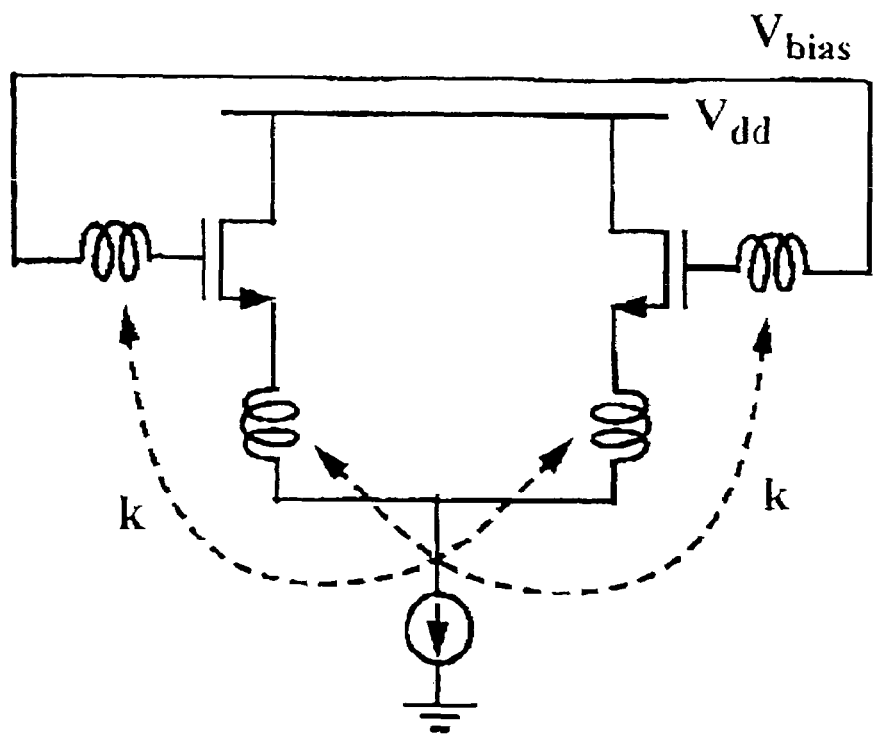
FIG. 20 shows a modification of the embodiment of FIG. 19 with a common bias current source.
Figure 21:
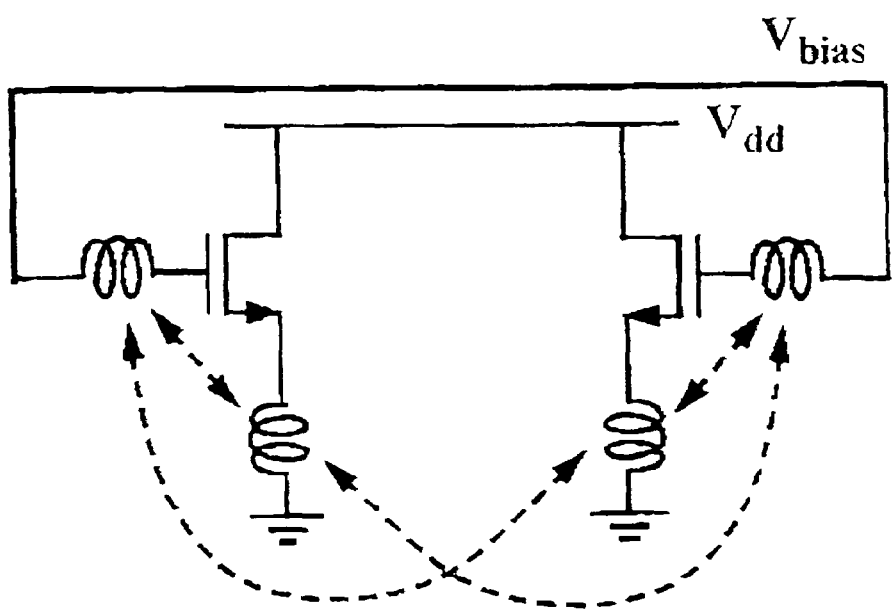
FIG. 21 shows an embodiment of the invention in the form of a common-drain differential oscillator with the two inductor pairs grouped as a single multi-port transformer.

FIG. 20 shows a further variation of the common drain differential embodiment of FIG. 19 in which a common bias current source is provided, while FIG. 21 illustrates an embodiment in the form of a common-drain design where the two inductor pairs are grouped together as a single multi-port design.

TABLE I

| | Vdd = 0.35 V (minimum oscillation voltage) | | |
|---|---|---|---|
| Vtune | Idd | $\omega_o$ | Phase noise @ 600 kHz |
| 0 V | 5 mA | 1.3737 GHz | −114.05 dBc |
| 0.2 V | 5 mA | 1.3770 GHz | −113.52 dBc |
| 0.4 V | 5 mA | 1.3790 GHz | −112.91 dBc |
| 0.6 V | 4 mA | 1.3810 GHz | −113.63 dBc |
| 0.8 V | 4 mA | 1.3840 GHz | −115.09 dBc |
| 1.0 V | 4 mA | 1.3880 GHz | −112.86 dBc |

TABLE II

| | Supply Voltage | Average Power | Center Frequency | Phase Noise @ 600 KHz | Process |
|---|---|---|---|---|---|
| [1] | 0.5 V | 3 mW | 2.0 GHz | −100.6 dBc/Hz | 0.2 μm CMOS/SIMOX |
| [2] | 1.0 V | 2.5 mW | 4.3 GHz | −112.8 dBc/Hz | 0.13 μm SOI CMOS |
| [3] | 1.4 V | 12.6 mW | 2.2 GHz | −125.0 dBc/Hz | 0.35 μm CMOS |
| [4] | 1.0 V | 5.5 mW | 2.4 GHz | −122.0 dBc/Hz | 0.25 μm CMOS |
| [5] | 0.85 V | 4.08 mW | 3.8 GHz | −94.8 dBc/Hz | 0.25 μm CMOS |
| [6] | 0.7 V | 1.96 mW | 2.4 GHz | −116.0 dBc/Hz | 0.25 μm CMOS |
| This Work | 0.35 V | 1.75 mW | 1.4 GHz | −114.0 dBc/Hz | 0.18 μm CMOS |

The invention claimed is:

1. A single-ended oscillator configured to generate a periodic signal, comprising a transistor and two electro-magnetically coupled inductors in positive feedback configuration, wherein one of the said inductors is connected to a first terminal of the transistor and the other is connected to a second terminal of the transistor to maintain the same phase of respective voltages at the two connections, wherein the oscillator includes only parasitic capacitances.

2. An oscillator as claimed in claim 1 wherein the transistor is a PMOS, NMOS, PNP, or NPN transistor.

3. An oscillator as claimed in claim 1 wherein the transistor is configured to be a voltage-controlled current source.

4. An oscillator as claimed in claim 1 wherein the transistor is configured to be a current-controlled current source.

5. The singled-ended oscillator of claim 1, wherein the oscillator is configured to operate at a supply voltage that is substantially close to or less than the turn-on threshold voltage of the transistor.

6. A differential oscillator comprising two single-ended oscillators each configured as the single-ended oscillator of claim 1, wherein the two single-ended oscillators are configured to share a common bias current source.

7. A differential oscillator comprising two single-ended circuits each configured as the single-ended oscillator of claim 5, wherein said single-ended circuits are cross-coupled together either electrically or electro-magnetically for additional positive feedback.

8. A differential oscillator comprising two single-ended circuits each configured as the single-ended oscillator of claim 1, wherein said single-ended circuits are cross-coupled together either electrically or electro-magnetically for additional positive feedback.

9. A differential oscillator as claimed in claim 8 in which the two coupled inductor pairs are grouped together as a single multi-port transformer.

10. The differential oscillator as claimed in claim 8, further comprising two variable capacitors coupled between said single-ended circuits to tune the oscillators.

11. The differential oscillator as claimed in claim 8, wherein the first and second terminals of the transistors are drain and source nodes of the transistors.

12. A differential oscillator comprising two circuits each configured as the oscillator of claim 11, wherein said circuits are cross-coupled together either electrically or electro-magnetically to provide additional positive feedback.

13. The differential oscillator of claim 12, wherein the two oscillators are configured to be coupled to a common bias current source.

14. The differential oscillator as claimed in claim 8, further comprising two variable capacitors coupled between said single-ended circuits to tune the oscillators.

15. A multiple-output oscillator comprising a plurality of single ended circuits each of which comprises a transistor and two inductors with one of the inductors coupled to a first terminal of the transistor and the other coupled to a second terminal of the transistor, wherein the inductors in each of the single ended circuits are electro-magnetically coupled with inductors in another single ended circuit to form pairs of inductors in a ring configuration, and the multiple-output oscillator includes only parasitic capacitances.

16. A multiple-output oscillator of claim 15, wherein the oscillator is configured to operates at a supply voltage that is substantially close to or less than the turn-on threshold voltage of the transistor.

17. A multiple-output oscillator of claim 15, wherein any two or more inductors are grouped together as a single multiple-port transformer.

18. An oscillator for generating a periodic signal, comprising: a transistor and two electro-magnetically coupled inductors configured in a positive feedback configuration void of any capacitor responsive to presence of parasitic capacitance, to generate the periodic signal, wherein one of the said inductors is coupled to a first terminal of the transistor and the other is coupled to a second terminal of the transistor to maintain respective voltages across the two couplings at substantially the same phase.

19. The oscillator as claimed in claim 18 wherein the transistor is configured to act as a selected one of a voltage-controlled current source or a current-controlled current source.

* * * * *

UNITED STATES PATENT AND TRADEMARK OFFICE
CERTIFICATE OF CORRECTION

PATENT NO.        : 7,411,468 B2
APPLICATION NO.   : 10/650686
DATED             : August 12, 2008
INVENTOR(S)       : Luong et al.

It is certified that error appears in the above-identified patent and that said Letters Patent is hereby corrected as shown below:

Column 10
Line 19, "...is configured to operates..." should read --...is configured to operate...--.

Signed and Sealed this

Tenth Day of February, 2009

JOHN DOLL
*Acting Director of the United States Patent and Trademark Office*